United States Patent
Oh et al.

(10) Patent No.: US 8,115,142 B2
(45) Date of Patent: Feb. 14, 2012

(54) PLATE, APPARATUS FOR ADJUSTING TEMPERATURE OF SUBSTRATE HAVING THE PLATE AND APPARATUS FOR PROCESSING SUBSTRATE HAVING THE PLATE

(75) Inventors: Chang-Suk Oh, Cheonan-si (KR); Hyun-Kyung Kim, Uiwang-si (KR)

(73) Assignee: Semes Co, Ltd., Chungnam (KR)

( * ) Notice: Subject to any disclaimer, the term of this patent is extended or adjusted under 35 U.S.C. 154(b) by 870 days.

(21) Appl. No.: 12/169,889

(22) Filed: Jul. 9, 2008

(65) Prior Publication Data
US 2009/0014431 A1 Jan. 15, 2009

(30) Foreign Application Priority Data

Jul. 11, 2007 (KR) .................. 10-2007-0069442

(51) Int. Cl.
*H05B 3/68* (2006.01)
*A21B 2/00* (2006.01)
(52) U.S. Cl. ............... 219/444.1; 219/443.1; 219/465.1; 219/462.1; 219/451.1; 219/463.1; 219/467.1; 392/416; 392/418
(58) Field of Classification Search ............... 219/444.1, 219/443.1, 448.1, 462.1, 451.1, 463.1, 465.1, 219/467.1, 466.1, 476, 478, 480, 482–4, 219/390, 405, 411; 392/416, 418
See application file for complete search history.

(56) References Cited

U.S. PATENT DOCUMENTS

| 4,361,749 | A | 11/1982 | Lord |
| 6,723,964 | B2 * | 4/2004 | Hwang et al. ............ 219/448.11 |
| 2002/0100680 | A1 | 8/2002 | Yamamoto et al. |

FOREIGN PATENT DOCUMENTS

| CN | 200480011359 | 5/2006 |
| CN | 200510123420 | 4/2007 |
| CN | 200510123421 | 5/2007 |

OTHER PUBLICATIONS

Office Action dated Nov. 6, 2009 for Chinese Patent Application No. 200810131541.2, 6 pages. (counterpart Chinese application to present application).

* cited by examiner

*Primary Examiner* — Shawntina Fuqua
(74) *Attorney, Agent, or Firm* — Daly, Crowley, Mofford & Durkee, LLP

(57) ABSTRACT

In a plate for adjusting a temperature of a substrate, a body of the plate supports the substrate. A first channel and a second channel are disposed within the body of the plate. The first channel has a first inlet and a first outlet and passes therethrough a first fluid to adjust the temperature of the substrate. The second channel has a second inlet adjacent to the first outlet and a second outlet adjacent to the first inlet and passes therethrough a second fluid to adjust the temperature of the substrate. Further, the first and second channels are disposed side by side. Thus, the temperature of the substrate may be adjusted uniformly as a whole.

20 Claims, 7 Drawing Sheets

PLATE, APPARATUS FOR ADJUSTING TEMPERATURE OF SUBSTRATE HAVING THE PLATE AND APPARATUS FOR PROCESSING SUBSTRATE HAVING THE PLATE

CROSS-REFERENCE TO RELATED APPLICATIONS

This application claims priority under 35 U.S.C. §119 to Korean Patent Application No. 2007-69442, filed on Jul. 11, 2007 in the Korean Intellectual Property Office (KIPO), the contents of which are incorporated herein by reference in their entirety.

BACKGROUND OF THE INVENTION

1. Field of the Invention

The present invention relates to a plate, an apparatus for adjusting a temperature of a substrate having the plate and an apparatus for processing a substrate having the plate. More particularly, the present invention relates to a plate for uniformly adjusting a temperature of a substrate as a whole, an apparatus for adjusting a temperature of a substrate having the plate and an apparatus for processing a substrate having the plate.

2. Description of the Related Art

In a semiconductor processing technology, semiconductor devices may be manufactured by performing various processes on a semiconductor substrate. For example, the semiconductor substrate may be heat-treated to manufacture desired semiconductor devices.

The semiconductor substrate may be heated to a predetermined temperature to perform the heat treatment. Further, the semiconductor substrate may be cooled to a predetermined temperature after performing the heat treatment.

An apparatus for adjusting a temperature of the semiconductor substrate may include a plate to support the semiconductor substrate and to heat or cool the semiconductor substrate. The plate may include a body having an upper surface for supporting the semiconductor substrate and a channel disposed within the body to pass fluid for heating or cooling the semiconductor substrate therethrough.

The channel may include an inlet and an outlet. Here, a temperature of a portion of the semiconductor substrate, which is located on a portion of the body adjacent to the inlet of the channel, may be higher or lower than that of another portion of the semiconductor substrate, which is located on another portion of the body adjacent to the outlet of the channel. As a result, the semiconductor substrate may be non-uniformly heated or cooled as a whole, thereby deteriorating the productivity of the semiconductor devices. Further, the time required to heat or cool the semiconductor substrate to a desired temperature may be increased.

SUMMARY OF THE INVENTION

Example embodiments of the present invention provide a plate for uniformly adjusting a temperature of a substrate as a whole.

Further, example embodiments of the present invention provide an apparatus having a plate capable of uniformly adjusting a temperature of a substrate as a whole.

Still further, example embodiments of the present invention provide an apparatus for processing a substrate having a plate capable of uniformly adjusting a temperature of the substrate as a whole.

In accordance with an aspect of the present invention, a plate for adjusting a temperature of a substrate may include a body for supporting the substrate, a first channel disposed within the body, the first channel having a first inlet and a first outlet and passing a first fluid therethrough to adjust the temperature of the substrate, and a second channel disposed within the body, the second channel having a second inlet adjacent to the first outlet and a second outlet adjacent to the first inlet and passing a second fluid therethrough to adjust the temperature of the substrate.

In some example embodiments of the present invention, the first inlet and the first outlet may be disposed at side surface portions of the body opposite to each other. Further, the second inlet and the second outlet may be disposed at side surface portions of the body opposite to each other.

In some example embodiments of the present invention, each of the first channel and the second channel may include two diverged sub-channels symmetrically disposed with respect to a center of the body.

In some example embodiments of the present invention, the sub-channels of the first channel may diverge at a point adjacent to the first inlet and may join at a point adjacent to the first outlet, and the sub-channels of the second channel may diverge at a point adjacent to the second inlet and may join at a point adjacent to the second outlet.

In some example embodiments of the present invention, the first channel and the second channel may be disposed side by side.

In some example embodiments of the present invention, an adiabatic member may be disposed between the first channel and the second channel to block heat transfer between the first fluid and the second fluid.

In some example embodiments of the present invention, each of the first channel and the second channel may have a curved shape.

In accordance with another aspect of the present invention, an apparatus for adjusting a temperature of a substrate may include a plate and a fluid supply section. The plate may include a body for supporting the substrate, a first channel disposed within the body, the first channel having a first inlet and a first outlet and passing a first fluid therethrough to adjust the temperature of the substrate, and a second channel disposed within the body, the second channel having a second inlet adjacent to the first outlet and a second outlet adjacent to the first inlet and passing a second fluid therethrough to adjust the temperature of the substrate. The fluid supply section may supply the first fluid and the second fluid to the plate.

In some example embodiments of the present invention, the first inlet and the first outlet may be disposed at side surface portions of the body opposite to each other. Further, the second inlet and the second outlet may be disposed at side surface portions of the body opposite to each other.

In some example embodiments of the present invention, each of the first channel and the second channel may include two diverged sub-channels symmetrically disposed with respect to a center of the body.

In some example embodiments of the present invention, the sub-channels of the first channel may diverge at a point adjacent to the first inlet and may join at a point adjacent to the first outlet, and the sub-channels of the second channel may diverge at a point adjacent to the second inlet and may join at a point adjacent to the second outlet.

In some example embodiments of the present invention, the first channel and the second channel may be disposed side by side.

In some example embodiments of the present invention, an adiabatic member may be disposed between the first channel and the second channel to block heat transfer between the first fluid and the second fluid.

In some example embodiments of the present invention, a flow rate adjusting section may be disposed between the first and second inlets and the fluid supply section to adjust flow rates of the first fluid and the second fluid which are supplied to the first channel and the second channel, respectively.

In some example embodiments of the present invention, the flow rate adjusting section may include an electronic valve.

In some example embodiments of the present invention, temperatures of the first fluid and the second fluid, which are supplied to the first channel and the second channel, respectively, may be measured by a temperature measuring section.

In some example embodiments of the present invention, the first fluid that is supplied to the first channel may have a temperature equal to that of the second fluid that is supplied to the second channel.

In some example embodiments of the present invention, lift pins may be movably disposed in a vertical direction through the body. The substrate may be loaded onto the body and may be unloaded from the body by the lift pins.

In some example embodiments of the present invention, the lift pins may be connected with a driving section for moving the lift pins in the vertical direction.

In accordance with still another aspect of the present invention, an apparatus for processing a substrate may include a heat-treating unit and a temperature-adjusting unit. The heat-treating unit may be provided to heat-treat the substrate, and the temperature-adjusting unit may be provided to adjust a temperature of the substrate that is heat-treated by the heat-treating unit. The temperature-adjusting unit may include a plate and a fluid supply. The plate may include a body for supporting the substrate, a first channel disposed within the body, the first channel having a first inlet and a first outlet and passing a first fluid therethrough to adjust the temperature of the substrate, and a second channel disposed within the body, the second channel having a second inlet adjacent to the first outlet and a second outlet adjacent to the first inlet and passing a second fluid therethrough to adjust the temperature of the substrate. The fluid supply may supply the first fluid and the second fluid to the plate.

In accordance with some example embodiments of the present invention, a plate may include a first channel and a second channel to pass therethrough a first fluid and a second fluid so as to adjust a temperature of a substrate, respectively. The first channel may have a first inlet and a first outlet, and the second channel may have a second inlet adjacent to the first outlet and a second outlet adjacent to the first inlet. Further, the first channel and the second channel may be disposed side by side within a body of the plate. Thus, the temperature of the substrate supported by the body of the plate may be adjusted uniformly as a whole.

BRIEF DESCRIPTION OF THE DRAWINGS

Example embodiments of the present invention will become readily apparent along with the following detailed description when considered in conjunction with the accompanying drawings, in which.

DESCRIPTION OF THE EMBODIMENTS

Figure 1:
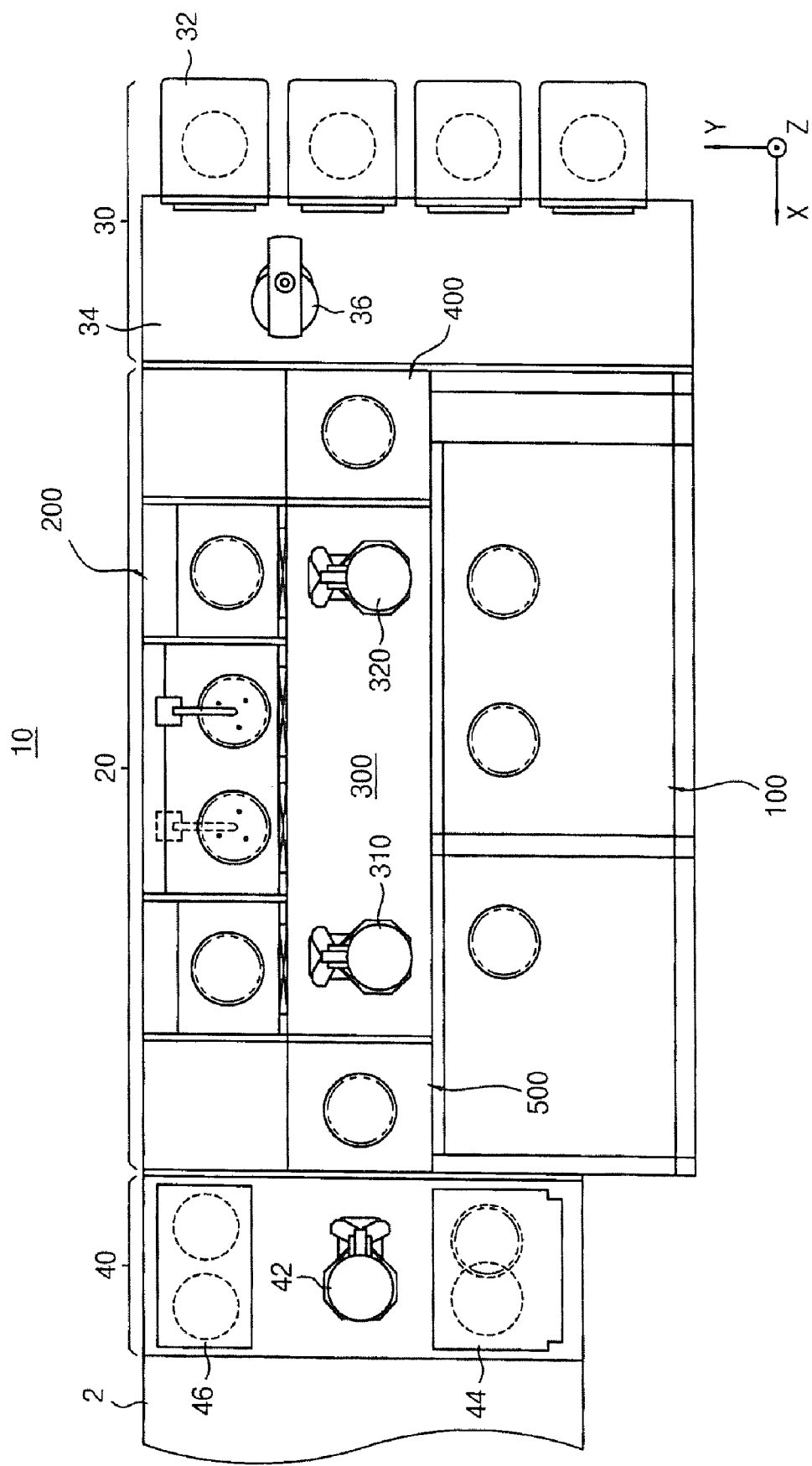
FIG. 1 is a plan view illustrating an apparatus for processing a substrate in accordance with an example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present invention.

Figure 2:
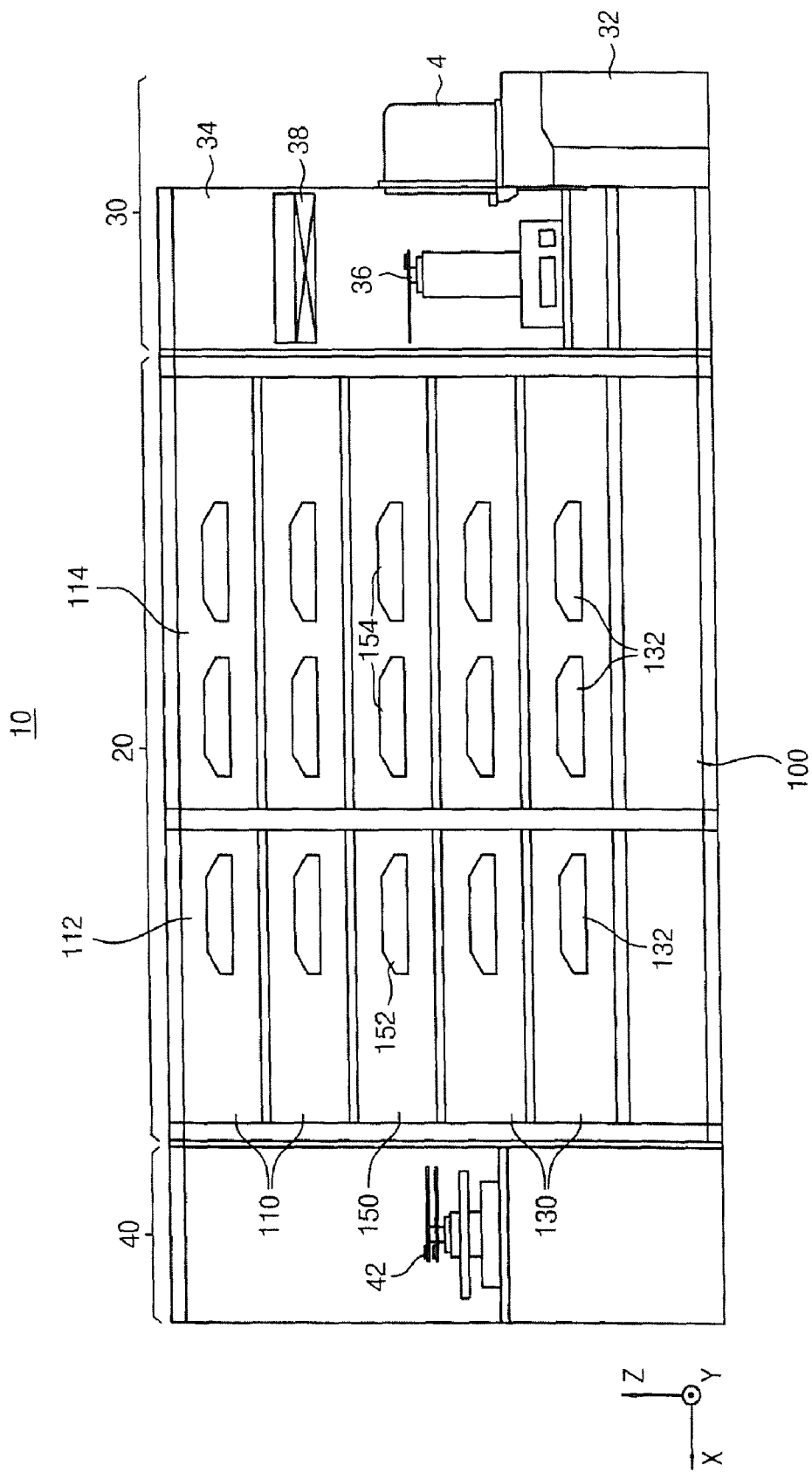
FIG. 2 is a side view illustrating a first processing block of the substrate processing apparatus shown in FIG. 1.
Figure 3:
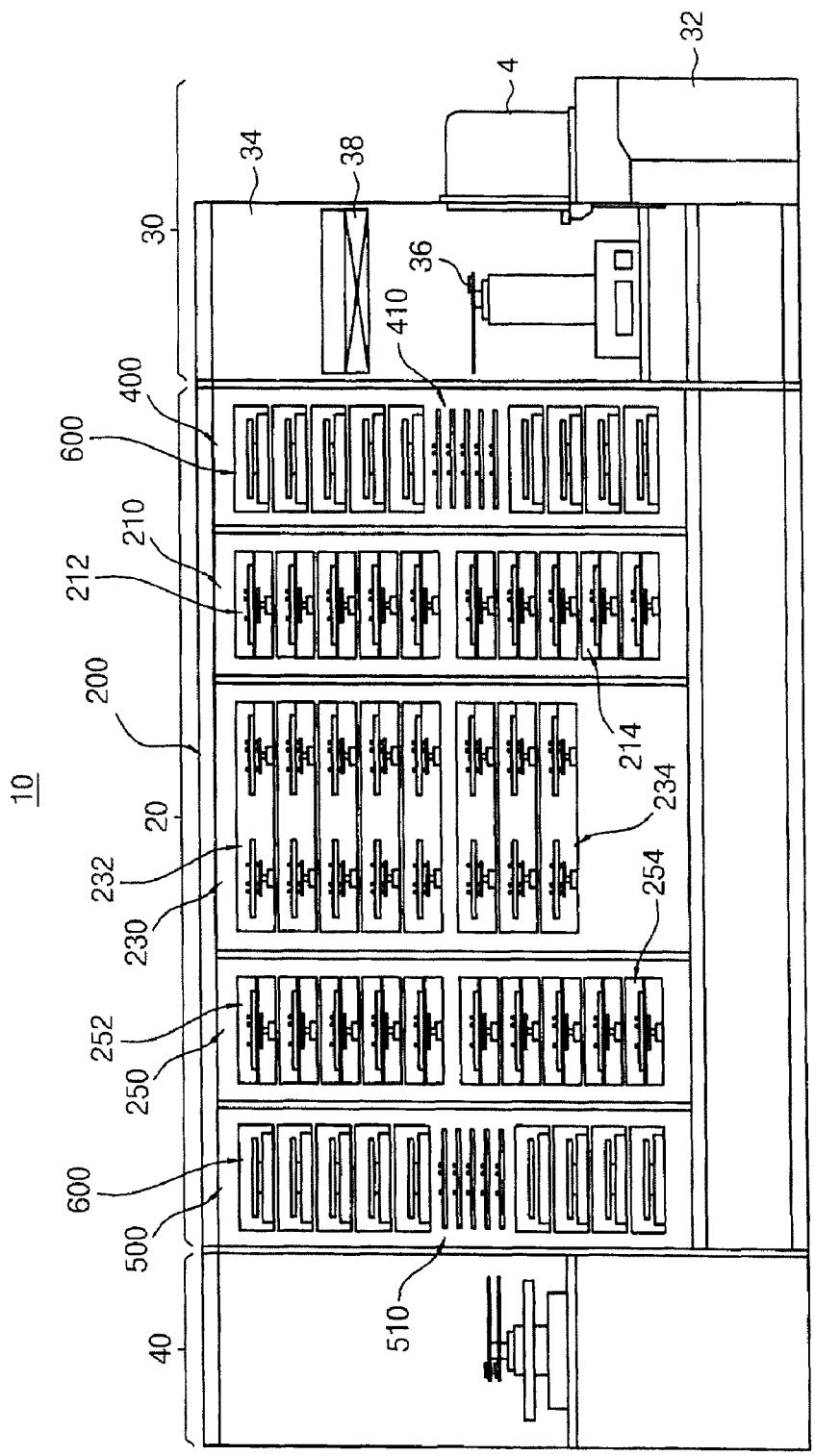
FIG. 3 is a side view illustrating a second processing block of the substrate processing apparatus shown in FIG. 1.

FIG. 1 is a plan view illustrating an apparatus for processing a substrate in accordance with an example embodiment of the present invention, FIG. 2 is a side view illustrating a first processing block of the substrate processing apparatus shown in FIG. 1, and FIG. 3 is a side view illustrating a second processing block of the substrate processing apparatus shown in FIG. 1.

Referring to FIGS. 1 to 3, in accordance with an example embodiment of the present invention, a substrate processing apparatus 10 may be used to process a semiconductor substrate such as a silicon wafer. For example, the apparatus 10 may be used to perform a coating process for forming a photoresist layer or a bottom anti-reflective coating (BARC) layer on a substrate, a developing process for forming a photoresist pattern on a substrate after performing an exposure process to transcribe a circuit pattern to a photoresist layer, a baking process for hardening a photoresist layer or a photoresist pattern, and the like.

The substrate processing apparatus 10 may include a substrate processing module 20 for processing substrates, a substrate transferring module 30 for transferring the substrates and an interface module 40 disposed between the substrate processing module 20 and an exposure apparatus 2.

The substrate transferring module 30 may include a plurality of load ports 32 for supporting containers 4 in which a plurality of substrates is each received and may transfer the substrates between the containers 4 and the substrate processing module 20. For example, a front-opening unified pod (FOUP) may be placed on each of the load ports 32.

A substrate transferring chamber 34 may be connected to the substrate processing module 20. A substrate transferring robot 36 may be disposed in the substrate transferring chamber 34. The substrate transferring robot 36 may be configured to move in horizontal and vertical directions, for example, in x-axis, y-axis and z-axis directions. Further, a robot arm of the substrate transferring robot 36 may be configured to rotate, expand and contract. A fan filter unit 38 may be disposed in an upper portion of the substrate transferring chamber 34 to supply purified air into the substrate transferring chamber 34.

The substrate processing module 20 may include a first processing block 100. The first processing block 100 may coat the substrate with a photoresist composition or an anti-reflective material to form a photoresist layer or a BARC layer and may develop a photoresist layer on the substrate which is subjected to an exposure process by the exposure apparatus 2.

The first processing block 100 may include upper unit blocks 110 and lower unit blocks 130 stacked in multiple stages. The upper unit blocks 110 may include a plurality of coating units, and the lower unit blocks 130 may include a plurality of developing units. Alternatively, the upper unit blocks 110 may include a plurality of developing units, and the lower unit blocks 130 may include a plurality of coating units.

As shown in the figures, the first processing block 100 may include two upper unit blocks 110 and two lower unit blocks 130. However, the scope of the present invention may not be limited by the numbers of the upper and lower unit blocks 110 and 130.

In accordance with an example embodiment of the present invention, each of the upper unit blocks 110 may include a first coating unit 112 for forming a BARC layer and a second coating unit 114 for forming a photoresist layer. The first and second coating units 112 and 114 may be arranged in the x-axis direction. In accordance with another example embodiment of the present invention, each of the upper unit blocks 110 may include a plurality of coating units arranged in a horizontal direction, e.g., in the x-axis direction. Each of the coating units may be provided to form a photoresist layer on a substrate.

Each of the lower unit blocks 130 may include a plurality of developing units 132 arranged in the x-axis direction. Each of the developing units 132 may be provided to develop a photoresist layer on a substrate which is subjected to an exposure process by the exposure apparatus 2.

In accordance with an example embodiment of the present invention, a middle unit block 150 may be disposed between the upper unit blocks 110 and the lower unit blocks 130. The middle unit block 150 may selectively include coating units and developing units. For example, the middle unit block 150 may include coating units or developing units. Alternatively, the middle unit block 150 may include one coating unit and a plurality of developing units or a plurality of coating units and one developing unit. Moreover, the middle unit block 150 may include a plurality of coating units and a plurality of developing units.

As shown in the figures, the middle unit block 150 includes one coating unit 152 and two developing units 154. However, the scope of the present invention may not be limited by the configuration of the middle unit block 150, e.g., the numbers of the coating unit(s) and the developing unit(s).

Particularly, the coating unit(s) and the developing unit(s) of the middle unit block 150 may be detachably disposed between the upper unit blocks 110 and the lower unit blocks 130. That is, the configuration of the middle unit block 150 may vary according to a predetermined process recipe. Thus, the throughput of the substrate process apparatus 10 may be improved.

The substrate processing module 20 may include a second processing block 200 opposite to the first processing block 100. The second processing block 200 may include a plurality of unit blocks arranged in the x-axis direction to heat-treat the semiconductor substrates.

A substrate transferring block 300 may be disposed between the first processing block 100 and the second processing block 200 to transfer the substrates. Transfer robots 310 and 320 may be disposed in the substrate transferring block 300 to transfer the substrates. For example, an upper transfer robot 310 and a lower transfer robot 320 may be disposed in the substrate transferring block 300.

The second processing block 200 may include first, second and third unit blocks 210, 230 and 250. The second unit block 230 may be disposed between the first and third unit blocks 210 and 250. The first and third unit blocks 210 and 250 may include a plurality of heating units 212, 214, 252 and 254 to heat the substrates, and the second unit block 230 may include a plurality of heat-treating units 232 and 234 to heat and cool the substrates. The heating units 212, 214, 252 and 254 and the heat-treating units 232 and 234 may be stacked in a vertical direction.

The first heating units 212 may be disposed in an upper portion of the first unit block 210, and the second heating units 214 may be disposed in a lower portion of the first unit block 210. The third heating units 252 may be disposed in an upper portion of the third unit block 250, and the fourth heating units 254 may be disposed in a lower portion of the third unit block 250. However, the scope of the present invention may not be limited by the positions of the heating units 212, 214, 252 and 254.

The substrate processing module 20 may further include a third processing block 400 and a fourth processing block 500 for adjusting a temperature of the substrates. The third and fourth processing blocks 400 and 500 may be disposed on both sides of the substrate transferring block 300 in a direction perpendicular to an arrangement direction of the first and second processing blocks 100 and 200, i.e., in the x-axis direction. In detail, the third and fourth processing blocks 400 and 500 may be disposed between the substrate transferring module 30, the substrate transferring block 300 and the interface module 40, respectively.

The third and fourth processing blocks 400 and 500 may be provided to cool the substrates heated by the second processing block 200. For example, each of the third and fourth processing blocks 400 and 500 may include a plurality of temperature-adjusting units 600 to cool the substrates to a predetermined temperature, for example, to a temperature of about 23° C. The temperature-adjusting units 600 may be stacked in multiple stages.

Further, the third and fourth processing blocks 400 and 500 may be used to secondarily cool the substrates firstly cooled by cooling plates of the upper or lower heat-treating units 232 or 234 to a temperature of about 23° C. The cooling plates of the heat-treating units 232 or 234 may firstly cool the substrates to a temperature of about 30° C. to about 50° C.

Each of the temperature-adjusting units 600 may include a cooling chamber (not shown) and a plate disposed therein. The plate may be maintained at a temperature of about 23° C. by fluid passing through a body of the plate. Here, the fluid may be used as a cooling agent for cooling the substrate. Further, a gate for transferring the substrate may be provided through a side wall of the cooling chamber adjacent to the substrate transferring block 300.

Although not shown in figures, the plate may be employed to heat the substrate. For example, the plate may be employed to heat the substrate in the heating units 212, 214, 252 and 254 and/or the heat-treating units 232 and 234.

Further, the third and fourth processing blocks 400 and 500 may include a first transfer stage 410 and a second transfer stage 510, respectively, to receive the semiconductor substrates. Each of the first and second transfer stages 410 and 510 may be disposed between the temperature-adjusting units 600. For example, the first and second transfer stages 410 and 510 may be adjacent to the middle unit block 150 of the first processing block 100 in a horizontal direction.

The interface module 40 may be disposed between the fourth processing block 500 and the exposure apparatus 2. An interface robot 42 may be disposed in the interface module 40 to transfer the substrates between the substrate processing module 20 and the exposure apparatus 2. The interface robot 42 may be configured to move in a vertical direction, and a robot arm of the interface robot 42 may be configured to rotate, expand and contract to transfer the substrates.

Further, an edge exposure unit 44 and a receiving stage 46 may be disposed in the interface module 40. The edge exposure unit 44 may be provided to remove an edge portion of the photoresist layer from an edge portion of the substrate. The substrates may stand ready in the receiving stage 46 before or after the exposure process. The edge exposure unit 44 and the receiving stage 46 may be disposed opposite to each other in the y-axis direction centering on the interface robot 42.

Figure 4:
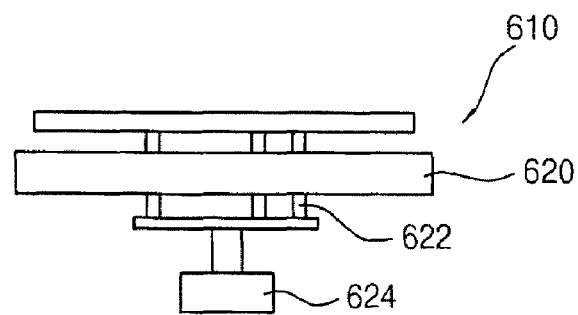
FIG. 4 is a front view illustrating the temperature-adjusting units shown in FIG. 3.
Figure 5:
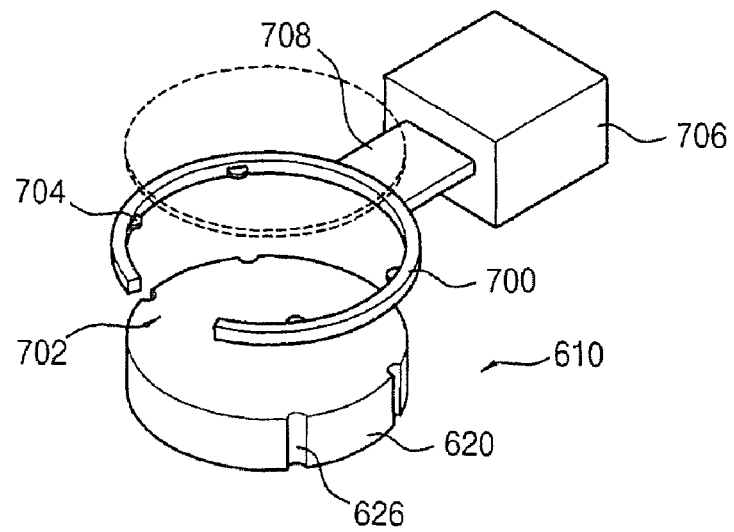
FIG. 5 is a perspective view illustrating another example of the temperature-adjusting units shown in FIG. 3.

FIG. 4 is a front view illustrating the temperature-adjusting units shown in FIG. 3, and FIG. 5 is a perspective view illustrating another example of the temperature-adjusting units shown in FIG. 3.

Referring to FIG. 4, each of the temperature-adjusting units 600 may include a plurality of lift pins 622 movably disposed through a plate 610 in a vertical direction to load and unload the semiconductor substrate.

The lift pins 622 may be disposed through a body 620 of the plate 610 by which the substrate is supported. For example, the lift pins 622 may be disposed movably in the vertical direction through the body 620 of the plate 610. Further, a driving section 624 may be disposed under the plate 610. The driving section 624 may be connected with the lift pins 622 to move the lift pins 622 in the vertical direction. The substrate may be loaded on an upper surface of the body 620 and may be unloaded from the upper surface of the body 620 by the lift pins 622.

For example, the lift pins 622 may upwardly move to support the substrate carried in by the upper or lower transfer robot 310 or 320, and may downwardly move to load the substrate on the body 620 of the plate 610. After adjusting the temperature of the substrate, the lift pins 622 may upwardly move to unload the substrate from the body 620 of the plate 610, and the substrate may be carried out by the upper and lower transfer robot 310 or 320.

As described above, although the plate 610 is used to cool the substrate, the plate 610 may be used to heat the substrate. For example, the plate 610 may be employed to heat the substrate in the heating units 212, 214, 252 and 254 and/or the heat-treating units 232 and 234.

Referring to FIG. 5, each of the temperature-adjusting units 600 may include an elevating member 700 to elevate the substrate so as to load and unload the substrate and a driving section 706 connected with the elevating member 700.

The elevating member 700 may have an open ring shape, for example, a horseshoe shape or a generally C-shape. An open portion 702 of the elevating member 700 may be provided to prevent the elevating member 700 from interfering with the robot arm (not shown) of the upper or lower transfer robot 310 or 320 and may be disposed toward the gate of the cooling chamber. A plurality of protrusions 704 may be disposed on an inner surface of the elevating member 700 to support the substrate.

The plate 610 may have a disk shape corresponding to the substrate, and a plurality of grooves 626 may be formed in a vertical direction in outer surface portions of the plate 610 to pass the protrusions 704 therethrough. The substrate transferred by the upper or lower transfer robot 310 or 320 may be elevated from the upper or lower transfer robot 310 or 320 by the elevating member 700. The elevating member 700 may then move down to load the substrate onto the plate 610. On the contrary, the substrate supported on the plate 610 may be elevated by the elevating member 700 and may then be carried out the cooling chamber by the upper or lower transfer robot 310 or 320.

The driving section 706 may be disposed on one side of the plate 610 in a horizontal direction and may be connected with the elevating member 700. Thus, a height of the temperature-adjusting units 600 may be reduced in comparison with a case in which the lift pins 622 are used.

Figure 6:
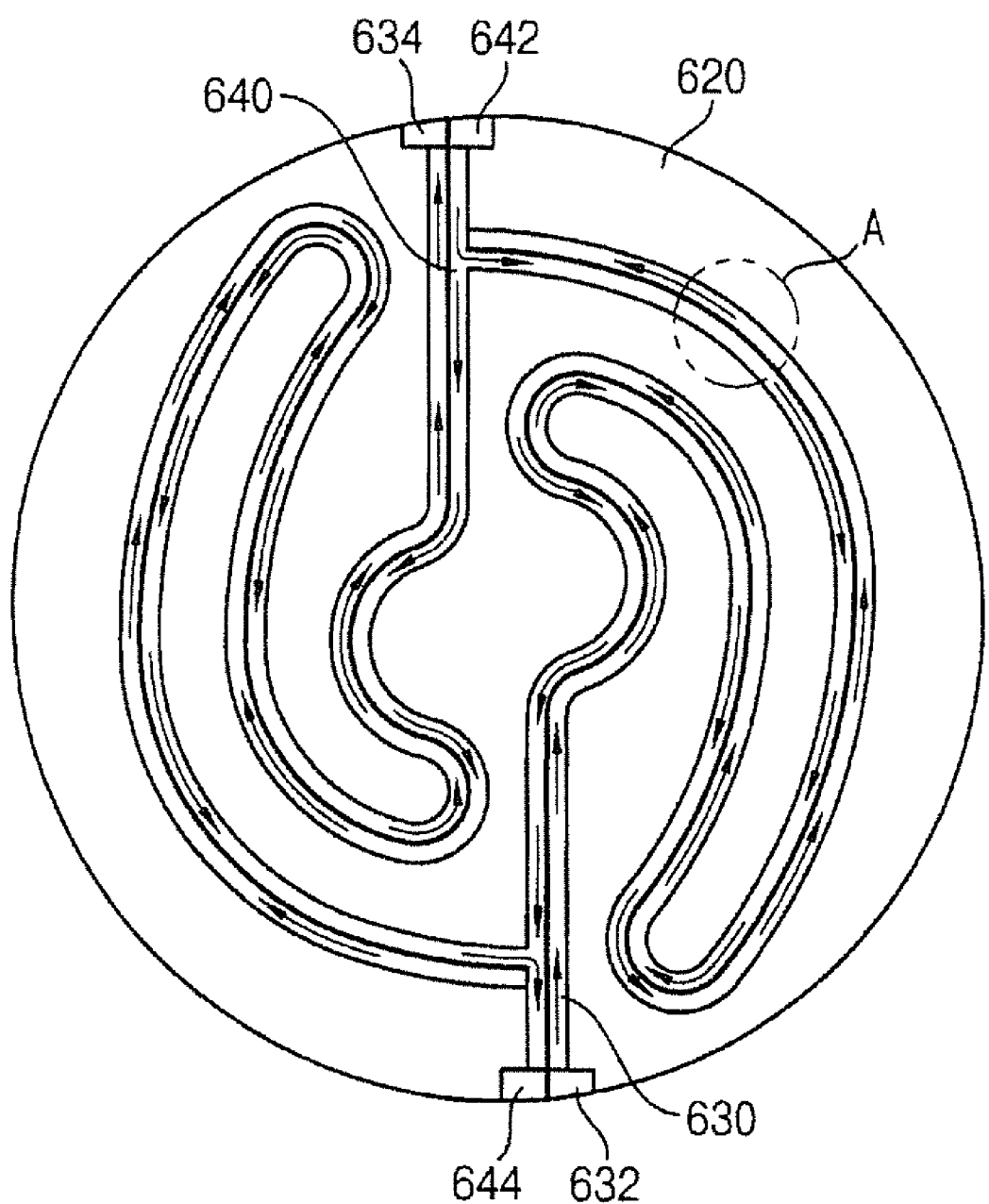
FIG. 6 is a plan view illustrating the plate shown in FIG. 3.
Figure 7:
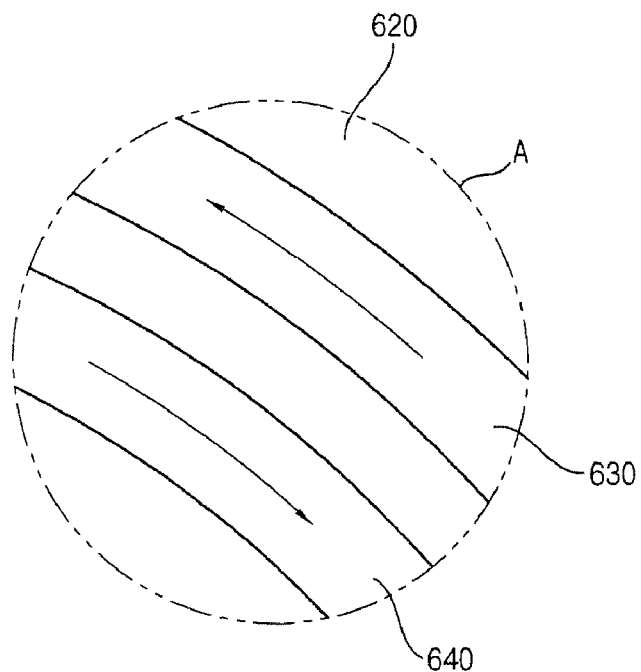
FIG. 7 is a partially enlarged view illustrating an example of a portion "A" shown in FIG. 6.
Figure 8:
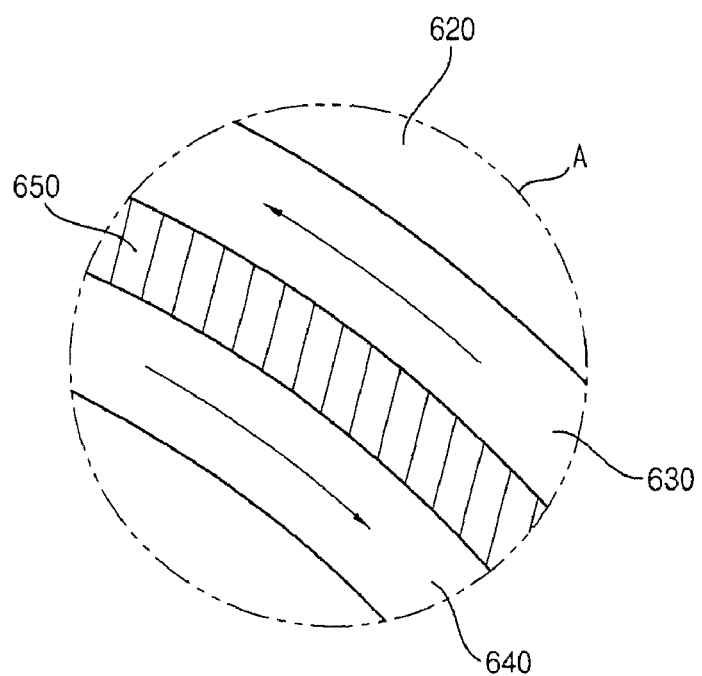
FIG. 8 is a partially enlarged view illustrating another example of the portion "A" shown in FIG. 6.

FIG. 6 is a plan view illustrating the plate shown in FIG. 3, FIG. 7 is a partially enlarged view illustrating an example of a portion "A" shown in FIG. 6, and FIG. 8 is a partially enlarged view illustrating another example of the portion "A" shown in FIG. 6.

Referring to FIGS. 6 and 7, the plate 610 in accordance with some example embodiments of the present invention may include a body 620 and a first channel 630 and a second channel 640 to pass fluid therethrough.

The body 620 may support the substrate. For example, the body 620 may have an upper surface to support the substrate. After performing a heat-treating process, the substrate may be transferred onto the body 620 of the plate 610 by the upper or lower transfer robot 310 or 320.

The first channel 630 may be disposed within the body 620. The first channel 630 may include two diverged sub-channels, and a first fluid may pass through the sub-channels of the first channel 630 to adjust the temperature of the substrate.

The second channel 640 may be disposed within the body 620. The second channel 640 may include two diverged sub-channels, and a second fluid may pass through the sub-channels of the first channel 640 to adjust the temperature of the substrate.

As described above, though each of the first and second channels 630 and 640 includes two sub-channels, the scope of the present invention may not be limited by the numbers of the sub-channels. Each of the sub-channels of the first and second channels 630 and 640 may have a curved shape to uniformly adjust the temperature of the substrate.

Further, the sub-channels of the first and second channels 630 and 640 may be symmetrically disposed with respect to a center of the body 620 to uniformly adjust the temperature of the substrate.

The first channel 630 may have a first inlet 632 and a first outlet 634, and the second channel 640 may have a second inlet 642 and a second outlet 644. In particular, the first inlet 632 and the first outlet 634 may be disposed at side surface portions of the body 620 opposite to each other. Further, the first inlet 632 may be disposed adjacent to the second outlet 644, and the first outlet 634 may be disposed adjacent to the second inlet 642.

Moreover, the first channel 630 and the second channel 640 may be disposed adjacent to each other. That is, the first channel 630 and the second channel 640 may be disposed side by side. Thus, the first fluid and the second fluid may flow in directions opposite to each other, and temperature difference between the first fluid and the second fluid may be compensated by heat transfer between the first fluid and the second fluid. As a result, temperature difference between the first inlet 632 and the first outlet 634 and/or the second inlet 642 and the second outlet 644 may be sufficiently compensated. That is, temperature difference between the first inlet 632 and the second outlet 644 and/or the second inlet 642 and the first outlet 634 may be sufficiently compensated by heat transfer, thereby uniformly adjusting the temperature of the substrate as a whole.

For example, the substrate loaded on the body 620 of the plate 610 may be cooled to a temperature of about 23° C. to about 27° C. by the first fluid and the second fluid. Alternatively, the substrate loaded on the body 620 of the plate 610 may be heated to a temperature of about 70° C. to about 100° C. by the first fluid and the second fluid.

The sub-channels of the first channel 630 may diverge at a point adjacent to the first inlet 632 and may join at a point adjacent to the first outlet 634. Further, the sub-channels of the second channel 640 may diverge at a point adjacent to the second inlet 642 and may join at a point adjacent to the second outlet 644.

Referring to FIG. 8, an adiabatic member 650 may be disposed between the first channel 630 and the second channel 640. The adiabatic member 650 may be provided to block heat transfer between the first fluid and the second fluid.

Temperature of the first fluid supplied to the first inlet 632 may be equal to that of the second fluid supplied to the second inlet 642.

Temperature of the first fluid passing through a first portion of the first channel 630, which is adjacent to the first inlet 632, may be different from that of the first fluid passing through a second portion of the first channel 630, which is adjacent to the first outlet 634. However, the temperature of the first fluid passing through the first portion of the first channel 630 may be equal to that of the second fluid passing through a first portion of the second channel 640, which is adjacent to the second inlet 642. Further, the temperature of the first fluid passing through the second portion of the first channel 630 may be equal to that of the second fluid passing through a second portion of the second channel 640, which is adjacent to the second outlet 644.

Heat transfer between the first fluid and the second fluid may be prevented by the adiabatic member 650. Thus, the temperature of the first fluid passing through the first channel 630 may be different from that of the second fluid passing through the second channel 640. However, because the first fluid and the second fluid flow in the directions opposite to each other, the temperature of the substrate may be uniformly adjusted as a whole.

Figure 9:
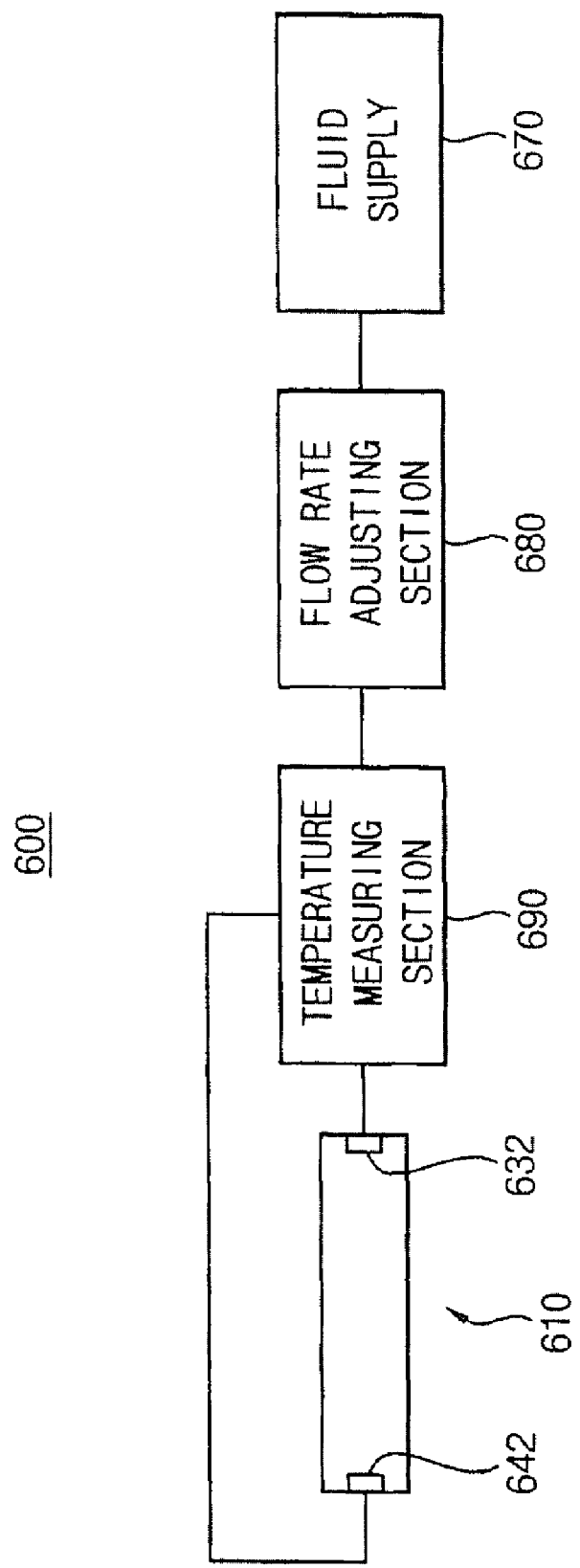
FIG. 9 is a schematic view illustrating the temperature-adjusting unit shown in FIG. 3.

FIG. 9 is a schematic view illustrating the temperature-adjusting unit shown in FIG. 3.

Referring to FIG. 9, the temperature-adjusting unit 600 may include a plate 610 and a fluid supply section 670.

The fluid supply section 670 may be provided to supply fluid to the plate 610. For example, the fluid supply 670 may be connected with the first inlet 632 and the second inlet 642 to supply the first fluid and the second fluid to the first channel 630 and the second channel 640, respectively.

The temperature-adjusting unit 600 may further include a flow rate adjusting section 680 to adjust flow rates of the first fluid and the second fluid. For example, the flow rate adjusting section 680 may be disposed between the first and second inlets 632 and 642 and the fluid supply section 670.

The flow rate adjusting section 680 may increase or decrease the flow rates of the first and second fluids in a stepwise manner to uniformly adjust the temperature of the substrate.

The flow rate adjusting section 680 may include an electronic valve. For example, the flow rate adjusting section 680 may include a solenoid valve. Although not shown in figures, the flow rate adjusting section 680 may further include a controller to control operation of the electronic valve.

The temperature-adjusting unit 600 may further include a temperature measuring section 690 to measure temperatures of the first and second fluids.

The temperature measuring section 690 may be disposed adjacent to the first inlet 632 and the second inlet 642. For example, the temperature measuring section 690 may be disposed between the plate 610 and the flow rate adjusting section 680.

The flow rate adjusting section 680 may adjust the flow rates of the first and second fluids according to the temperature of the first and second fluids measured by the temperature measuring section 690, thereby uniformly adjusting the temperature of the substrate to a predetermined temperature. Further, the fluid supply 670 may adjust the temperature of the first and second fluids to a predetermined temperature according to according to the temperature of the first and second fluids measured by the temperature measuring section 690.

In accordance with the example embodiments of the present invention, a plate may include a first channel and a second channel to pass therethrough a first fluid and a second fluid so as to adjust the temperature of a substrate, respectively. The first channel may have a first inlet and a first outlet, and the second channel may have a second inlet adjacent to the first outlet and a second outlet adjacent to the first inlet. Further, the first channel and the second channel may extend side by side within a body of the plate. Thus, the temperature of the substrate supported by the body of the plate may be adjusted uniformly as a whole.

Although the example embodiments of the present invention have been described, it is understood that the present invention should not be limited to these example embodiments but various changes and modifications can be made by those skilled in the art within the spirit and scope of the present invention as hereinafter claimed.

What is claimed is:

1. A plate for adjusting a temperature of a substrate, the plate comprising:
   a body for supporting the substrate;
   a first channel disposed within the body, the first channel having a first inlet and a first outlet and passing a first fluid therethrough to adjust the temperature of the substrate; and
   a second channel disposed within the body, the second channel having a second inlet adjacent to the first outlet and a second outlet adjacent to the first inlet and passing a second fluid therethrough to adjust the temperature of the substrate,
   wherein the first inlet and the first outlet are disposed at side surface portions of the body opposite to each other.

2. The plate of claim 1, wherein each of the first channel and the second channel comprises two diverged sub-channels symmetrically disposed with respect to a center of the body.

3. The plate of claim 2, wherein the sub-channels of the first channel diverge at a point adjacent to the first inlet and join at a point adjacent to the first outlet, and the sub-channels of the second channel diverge at a point adjacent to the second inlet and join at a point adjacent to the second outlet.

4. The plate of claim 1, wherein the first channel and the second channel are disposed side by side.

5. The plate of claim 1, further comprising an adiabatic member disposed between the first channel and the second channel to block heat transfer between the first fluid and the second fluid.

6. The plate of claim 1, wherein each of the first channel and the second channel has a curved shape.

7. An apparatus for adjusting a temperature of a substrate, the apparatus comprising:
   a plate comprising:
      a body for supporting the substrate;
      a first channel disposed within the body, the first channel having a first inlet and a first outlet and passing a first fluid therethrough to adjust the temperature of the substrate; and
      a second channel disposed within the body, the second channel having a second inlet adjacent to the first outlet and a second outlet adjacent to the first inlet and passing a second fluid therethrough to adjust the temperature of the substrate; and
   a fluid supply section supplying the first fluid and the second fluid to the plate,
   wherein the first inlet and the first outlet are disposed at side surface portions opposite to each other.

8. The apparatus of claim 7, wherein each of the first channel and the second channel comprises two diverged sub-channels symmetrically disposed with respect to a center of the body.

9. The apparatus of claim 8, wherein the sub-channels of the first channel diverge at a point adjacent to the first inlet and join at a point adjacent to the first outlet, and the sub-channels of the second channel diverge at a point adjacent to the second inlet and join at a point adjacent to the second outlet.

10. The apparatus of claim 7, wherein the first channel and the second channel are disposed side by side.

11. The apparatus of claim 10, further comprising an adiabatic member disposed between the first channel and the second channel to block heat transfer between the first fluid and the second fluid.

12. The apparatus of claim 7, further comprising a flow rate adjusting section disposed between the first and second inlets and the fluid supply section to adjust flow rates of the first fluid and the second fluid which are respectively supplied to the first channel and the second channel.

13. The apparatus of claim 12, wherein the flow rate adjusting section comprises an electronic valve.

14. The apparatus of claim 7, further comprising a temperature measuring section measuring temperatures of the first fluid and the second fluid which are respectively supplied to the first channel and the second channel.

15. The apparatus of claim 7, wherein the first fluid that is supplied to the first channel has a temperature equal to that of the second fluid that is supplied to the second channel.

16. The apparatus of claim 7, further comprising lift pins movably disposed in a vertical direction through the body to load the substrate on the body and to unload the substrate from the body.

17. The apparatus of claim 16, further comprising a driving section connected with the lift pins to move the lift pins in the vertical direction.

18. An apparatus for processing a substrate, the apparatus comprising:
   a heat-treating unit configured to heat-treat the substrate; and
   a temperature-adjusting unit configured to adjust a temperature of the substrate which is heat-treated by the heat-treating unit, the temperature-adjusting unit comprising:
   a plate comprising:
      a body for supporting the substrate;
      a first channel disposed within the body, the first channel having a first inlet and a first outlet and passing a first fluid therethrough to adjust the temperature of the substrate; and a second channel disposed within the body, the second channel having a second inlet adjacent to the first outlet and a second outlet adjacent to the first inlet and passing a second fluid therethrough to adjust the temperature of the substrate; and a fluid supply section supplying the first fluid and the second fluid to the plate, wherein the first inlet and the first outlet are disposed at side surface portions opposite to each other.

19. The apparatus of claim 18 wherein each of the first channel and the second channel comprises two diverged sub-channels symmetrically disposed with respect to a center of the body.

20. The apparatus of claim 18 wherein the plate further comprises an adiabatic member disposed between the first channel and the second channel to block heat transfer between the first fluid and the second fluid.

* * * * *